(12) United States Patent
Tortorelli

(10) Patent No.: US 10,985,212 B2
(45) Date of Patent: Apr. 20, 2021

(54) MULTI-COMPONENT CELL ARCHITECTURES FOR A MEMORY DEVICE

(71) Applicant: Micron Technology, Inc., Boise, ID (US)

(72) Inventor: Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/385,636

(22) Filed: Apr. 16, 2019

(65) Prior Publication Data

US 2020/0335551 A1    Oct. 22, 2020

(51) Int. Cl.

| | | |
|---|---|---|
| G11C 13/00 | (2006.01) | |
| G11C 11/56 | (2006.01) | |
| G11C 7/00 | (2006.01) | |
| H01L 23/528 | (2006.01) | |
| H01L 27/24 | (2006.01) | |
| H01L 45/00 | (2006.01) | |

(52) U.S. Cl.
CPC ........ *H01L 27/2463* (2013.01); *G11C 13/003* (2013.01); *G11C 13/0004* (2013.01); *G11C 13/004* (2013.01); *G11C 13/0069* (2013.01); *H01L 45/06* (2013.01); *H01L 45/1253* (2013.01); *H01L 45/141* (2013.01); *G11C 13/0026* (2013.01); *G11C 13/0028* (2013.01); *H01L 45/1233* (2013.01)

(58) Field of Classification Search
CPC . H01L 27/2483; H01L 45/1233; H01L 45/06; H01L 45/1253; H01L 45/141; G11C 13/0004; G11C 13/003; G11C 13/004; G11C 13/0069; G11C 13/0026; G11C 13/0028
USPC .......................................................... 365/163
See application file for complete search history.

(56) References Cited

U.S. PATENT DOCUMENTS

| 8,377,741 B2 | 2/2013 | Savransky et al. |
| 9,406,881 B1 | 8/2016 | Tortorelli et al. |
| 9,607,691 B1 | 3/2017 | Allegra et al. |

(Continued)

OTHER PUBLICATIONS

U.S. Appl. No. 15/893,100, filed Feb. 9, 2018.

(Continued)

*Primary Examiner* — Ly D Pham
(74) *Attorney, Agent, or Firm* — Holland & Hart LLP

(57) ABSTRACT

Methods, systems, and devices for multi-component cell architectures for a memory device are described. A memory device may include self-selecting memory cells that include multiple self-selecting memory components (e.g., multiple layers or other segments of a self-selecting memory material, separated by electrodes). The multiple self-selecting memory components may be configured to collectively store one logic state based on the polarity of a programming pulse applied to the memory cell. The multiple memory component layers may be collectively (concurrently) programmed and read. The multiple self-selecting memory components may increase the size of a read window of the memory cell when compared to a memory cell with a single self-selecting memory component. The read window for the memory cell may correspond to the sum of the read windows of each self-selecting memory component.

12 Claims, 7 Drawing Sheets

(56) References Cited

U.S. PATENT DOCUMENTS

| | | | |
|---|---|---|---|
| 9,947,402 B1* | 4/2018 | Bhavnagarwala | G11C 13/004 |
| 10,008,665 B1 | 6/2018 | Gealy et al. | |
| 2007/0187801 A1 | 8/2007 | Asao et al. | |
| 2010/0032725 A1 | 2/2010 | Baba et al. | |
| 2010/0073997 A1* | 3/2010 | Elmegreen | H01L 45/06 |
| | | | 365/157 |
| 2011/0155984 A1 | 6/2011 | Redaelli et al. | |
| 2011/0205782 A1* | 8/2011 | Costa | G11C 13/0069 |
| | | | 365/148 |
| 2012/0120711 A1* | 5/2012 | Rabkin | G11C 13/0069 |
| | | | 365/148 |
| 2014/0299833 A1 | 10/2014 | Cheong et al. | |
| 2014/0312296 A1* | 10/2014 | Jo | H01L 27/2418 |
| | | | 257/4 |
| 2014/0317365 A1* | 10/2014 | Meir | G11C 27/005 |
| | | | 711/162 |
| 2016/0005965 A1 | 1/2016 | Redaelli | |
| 2018/0040370 A1 | 2/2018 | Tortorelli et al. | |
| 2018/0315475 A1 | 11/2018 | Redaelli et al. | |
| 2019/0164600 A1* | 5/2019 | Castro | G11C 13/0061 |
| 2019/0206489 A1* | 7/2019 | Wang | G11C 13/0069 |

OTHER PUBLICATIONS

ISA/KR, International Search Report and Written Opinion of the International Searching Authority, Int'l Appl. No. PCT/US20/24471, dated Jul. 7, 2020, Korean Intellectual Property Office, Seo-gu, Daejeon, Republic of Korea, 11 pgs.

* cited by examiner

US 10,985,212 B2

MULTI-COMPONENT CELL ARCHITECTURES FOR A MEMORY DEVICE

BACKGROUND

The following relates generally to a system that includes at least one memory device and more specifically to multi-component cell architectures for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory (SSM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices may include increasing memory cell density, increasing read/write speeds, increasing reliability, increasing data retention, reducing power consumption, or reducing manufacturing costs, among other metrics. For example, improving memory devices may include increasing read or write margins (windows), which may in some cases relate to improved reliability. Decreasing sensitivity to degradation or destruction of a stored logic state over time, which may in some cases relate to improved data retention and other improvements, may be desired.

DETAILED DESCRIPTION

Figure 1:
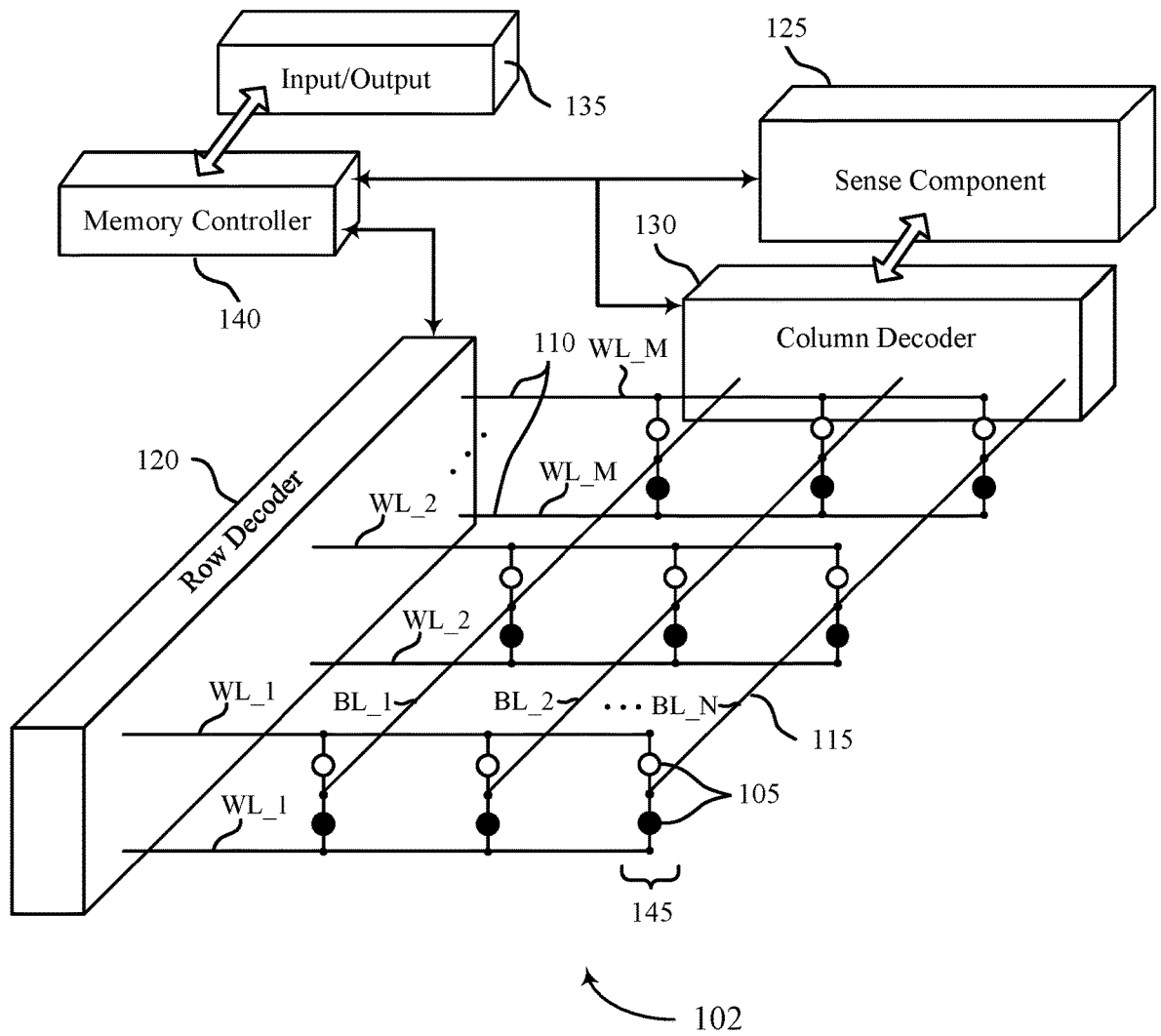
FIG. 1 illustrates an example memory device that supports multi-component cell architectures in accordance with examples as disclosed herein.

A self-selecting memory cell architecture may store a logic state in a material (e.g., based on a physical characteristic of the material), such as a chalcogenide material, where the stored logic state may be based at least in part on the polarity of a voltage (e.g., a voltage pulse) applied across the material during a write operation. The polarity of the voltage used for the write operation may result in the material having a particular behavior or characteristic, such as a particular threshold voltage or resistance, which may correspond to a logic state stored by the memory cell. For example, a subsequent read operation may detect the behavior or characteristic, and thus may detect the polarity of the prior write voltage, and thus the logic state stored by the memory cell may be determined.

For example, a write operation in which the applied voltage has a first polarity may result in the material having a relatively high threshold voltage, whereas a write operation in which the applied voltage has a second polarity may result in the material having a relatively low threshold voltage. In such examples, a later read operation may include the application of another voltage (a read voltage) across the memory cell, and the presence or absence of current through the memory cell in response to the read voltage may be used to determine (e.g., distinguish) whether the memory cell was written with one voltage polarity or another, thereby providing an indication of the logic state that was written to the memory cell (e.g., each logic state may correspond to a different threshold voltage of the material).

The difference in threshold voltages of the memory cell depending on the logic state stored by the memory cell (e.g., the difference between the threshold voltage when the memory cell was written with a voltage pulse having the first polarity versus written with a voltage pulse having the second polarity) may correspond to the read window of the memory cell. A large (increased) read window may generally be desirable (e.g., a large difference between the threshold voltages associated with a logic state '0' versus a logic state '1'). A static (stable) read window may also be desirable (e.g., threshold voltages of the memory cell 105 that do not change substantially over time, such that the bounds and midpoint of the read window do not shift or drift). A larger read window for the memory cell may increase the reliability of the memory device by increasing the difference between the threshold voltage associated with each logic state and thus the likelihood and ease of accurate read operations. Further, the more static read window (e.g., a read window with less drift) may make the use of determined reference voltages more reliable over time (e.g., may avoid, delay, or mitigate the need for subsequently determining or adjusting a reference voltage used for a read operation), which may simplify or enhance the reliability of read operations, among other benefits.

As used herein, a layer of self-selecting memory material within a memory cell may be referred to as a self-selecting memory component, and a self-selecting memory component may provide both a storage functionality and a selection functionality for the memory cell. A storage functionality may correspond to an ability to store or contribute to the storage of a logic state. A selection functionality may correspond to an ability to (i) allow a voltage to be placed across or a current to pass through a memory cell when it is the target (selected) memory cell for an access (e.g., write or read) operation and (ii) prevent the voltage from being placed across or the current from passing through the memory cell when it is not a target (is an untargeted or unselected) memory cell for an access operation.

In some cases, increasing the thickness of a layer of self-selecting memory material may increase the read window (separation of threshold voltages) for the material, but may also increase the absolute threshold voltages of the material, and thus the magnitude of at least some of the voltages used in read or write operations for a memory cell that includes the material. The use of large voltages in read or write operations for a memory cell may be undesirable due to power consumption, circuit complexity, or other drawbacks. Further, in some cases, the increase in read window associated with increased thickness of a single layer of self-selecting memory material may be small relative to the increased absolute threshold voltages, and thus the penalties associated with increased operational voltages may be outweighed by the benefits associated with an increased read window.

In accordance with examples of the present disclosure, a device may include memory cells that each include multiple layers of a self-selecting memory material (e.g., with each layer of the self-selecting memory material with a memory cell separated by a carbon electrode) in order to increase the size of the read window for the memory cell. The individual threshold voltages of the self-selecting memory material layers included in a memory cell may "stack" (sum), such that a read window of the memory cell corresponds to a sum of the respective read windows of the individual layers. Further, because the absolute threshold voltages of a layer may scale faster than the read window of the layer, individual layers of self-selecting memory material within a memory cell may be relatively thin. Thus, a larger read window for the memory cell may be achieved without (or at least with less) increase in the absolute magnitude of threshold voltages and operational voltages associated with the memory cell.

Accordingly, for example, a memory device with two layers of a self-selecting memory material may have a read window that is substantially double the size of the read window of a memory cell with only one layer of the material. Further, a memory device with three layers of the self-selecting memory material may have a read window that is substantially three times the size of the read window of the memory cell with only one layer of the material. That is, a memory device with N layers of the self-selecting memory material may have a read window that is substantially N times the size of the read windows of the memory cell with only one layer of the material. In some instances, one or more layers of self-selecting memory material within a memory cell may be configured (e.g., be of a different material, be of a different stoichiometry, or be formed using different formation techniques or parameters than at least one other layer of self-selecting memory material within the memory cell) to reduce leakage of the memory cell, where leakage may generally refer to the deterioration (degradation) of a stored logic state due to a threshold voltage of the material drifting over time. Such a material layer may increase the size of the read window, while also decreasing the leakage of the memory cell. The decrease in leakage may allow for an increase in memory array size or provide other benefits, which may further allow for an increase in tile size of a memory array or be otherwise beneficial.

Features of the disclosure are initially described in the context of a memory device and a memory array as described with reference to FIGS. 1 and 2. Features of the disclosure are then described in the context of memory cell stacks and corresponding read windows as described with reference to FIGS. 3 and 4. These and other features of the disclosure are further illustrated by and described with reference to an apparatus diagram and flowcharts that relate to multi-component cell architectures for a memory device as described with references to FIGS. 5-7.

FIG. 1 illustrates an example memory device 100 that supports multi-component cell architectures for a memory device in accordance with examples as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1. In some examples, a memory cell 105 may be configured to store one of more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two and may in some cases be one or more than two. Each level may be aligned or positioned so that memory cells 105 may be aligned (exactly, overlapping, or approximately) with one another across each level, forming a memory cell stack 145. In some cases, the memory cell stack 145 may include multiple memory cells 105 laid on top of another while sharing an access line. The memory cells 105 may in some cases be configured to each store one bit of data.

A memory cell 105 may, in some examples, be a self-selecting memory cell. A self-selecting memory cell 105 may include one or more components of a material (e.g., a chalcogenide material) that each function both as a storage element and as a cell selector (selection) element, thereby eliminating the need for separate cell selector circuitry (a selector circuitry that does not contribute to storage). Such an element may be referred to as a storage and selector component (or element), or as a self-selecting memory component (or element). In contrast, other types of memory cells, such as DRAM or PCM cells, may each include a separate (dedicated) cell selector element such as a three-terminal selector element (e.g., a transistor) to select the memory cell without contributing to the storage of any logic state. These separate selector elements may be fabricated underneath the DRAM or PCM memory cells, for example.

In various examples, a memory cell 105 may include multiple components that each include a self-selecting memory material, and thus may include multiple self-selecting memory components. The material may have one or more variable and configurable characteristics that are representative of (e.g., correspond to) different logic states, which may include different electrical resistances, different threshold voltages, or others. For example, a material may take different forms, different atomic or ionic configurations or distributions, or otherwise maintain different characteristics based on a polarity of a voltage (e.g., an orientation of an electric field) that is placed (applied) across the material during a write operation (e.g., as a pulse), and such a material may have different electrical resistances or threshold characteristics depending on a polarity of the voltage during the write operation. In one example, a state of the material after a write operation with a positive voltage polarity may have a relatively low electrical resistance or threshold voltage, whereas a state of the material after a write operation with a negative voltage polarity may have a relatively high electrical resistance or threshold voltage.

The difference between the relatively low threshold voltage (e.g., associated with a first logic state) and the relatively high threshold voltage (e.g., associated with a second logic state) may correspond to the read window (budget, margin) for the memory cell 105. In some cases, an observed resistance or threshold voltage of a written memory cell 105 (and thus a read window) may, along with being based on the polarity of the write voltage, also be based at least in part on a polarity of a voltage used for the read operation. For example, an observed resistance or threshold voltage of the memory cell 105 may be dependent on whether a read pulse used during the read operation has a same polarity or has a different (opposite) polarity as the write pulse in a preceding write operation.

Memory array 102 may include multiple word lines 110 for each deck, labeled WL_1 through WL_M, and multiple bit lines 115, labeled BL_1 through BL_N, where M and N depend on the array size. In some examples, each row of memory cells 105 is connected to a word line 110, and each column of memory cells 105 is connected to a bit line 115. In some cases, word lines 110 and bit lines 115 may be referred to as access lines because they may permit access to memory cells 105. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Word lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as a word line 110 and a bit line 115. This intersection may be referred to as an address of a memory cell 105. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are in electronic communication with (e.g., connected to) the same word line 110 or bit line 115 may be referred to as untargeted memory cells 105.

Electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include multiple self-selecting memory components separated from each other and from access lines 110, 115 by electrodes. As previously noted, for self-selecting memory cells 105, a single component (e.g., a section or layer of chalcogenide material within the memory cell 105) may be used as both a storage element (e.g., to store or contribute to the storage of a state of memory cell 105) and as a selector element (e.g., to select or contribute to the selection of the memory cell 105).

One side of a first electrode may be coupled to a word line 110 and the other side of the first electrode to a first self-selecting memory component. In addition, one side of a second electrode may be coupled to a bit line 115 and the other side of the second electrode to a second self-selecting memory component. A third electrode may be between the first self-selecting memory component and the second self-selecting memory component. The first electrode, the second electrode, and the third electrode may be the same material (e.g., carbon) or of various (different) materials. In some cases, the electrodes may be a different material than the access lines. In some examples, the electrodes may shield a material (e.g., a chalcogenide material) included in a self-selecting memory component from the word line 110, from the bit line 115, and from each other to prevent chemical interaction between the material and the word line 110, the bit line 115, or another-selecting memory component. In some cases, one or more additional components that include self-selecting chalcogenide material (e.g., for a total of N such components) and one or more additional electrodes (e.g., for a total of N+1 electrodes) may be included in a memory cell 105.

Operations such as reading and writing may be performed on memory cells 105 by activating or selecting a corresponding word line 110 and bit line 115. Accessing memory cells 105 may be controlled through a row decoder 120 and a column decoder 130. For example, a row decoder 120 may receive a row address from the memory controller 140 and activate the appropriate word line 110 based on the received row address. Such a process may be referred to as decoding a row or word line address. Similarly, a column decoder 130 may receive a column address from the memory controller 140 and activate the appropriate bit line 115. Such a process may be referred to as decoding a column or bit line address. A row decoder 120 and/or column decoder 130 may be examples of decoders implemented using decoder circuitry, for example. In some cases, row decoder 120 and/or column decoder 130 may include charge pump circuitry that is configured to increase a voltage applied to a word line 110 or bit line 115 (respectively).

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

Self-selecting memory components within a memory cell 105 may be set or written or refreshed by biasing a corresponding word line 110 and bit line 115 (e.g., via the memory controller 140, row decoder 120, and/or column decoder 130). In other words, a logic state may be stored collectively by the multiple self-selecting memory components of a memory cell 105 based on a write voltage (e.g., via a cell access signal, via a cell write signal or write pulse). Row decoder 120 and column decoder 130 may accept data, for example, via input/output component 135, to be written to the memory cells 105. In some examples, one or more aspects of row decoder 120, column decoder 130, or a sense component 125 may support read or write operations. The multiple self-selecting memory components of a memory cell 105 may be collectively (e.g., all simultaneously) written with a single logic state that is based at least in part on a polarity of a write voltage (pulse) placed across the memory cell 105, which, in some examples, may be accompanied by a write current (e.g., based at least in part on the write voltage) or other heating of the memory cell. The single logic state may correspond to a threshold voltage that is a combination of the respective threshold voltages of the individual self-selecting memory components.

The memory controller 140 may be configured to execute a write operation that can program a memory cell 105. For example, the memory controller 140 may be configured to apply, during a write operation, one or more pulses to memory cell 105. In some examples, a memory cell 105 may be programmed to store a first logic state by applying a write pulse having a (e.g., positive) first polarity and a second logic state by applying a write pulse having a second (e.g., negative) polarity.

The memory cell 105 may then be read by applying a voltage across the cell to sense the state of the memory cell 105. The threshold voltage seen during a read operation may be based on the polarity of the write pulse and also based at least in part on the polarity of the read pulse. For example, with a read pulse having the first polarity, the threshold voltage detected during the read operation may be different if write pulse had the first polarity versus the second polarity, and a difference between the two threshold voltages may correspond to a read window for a read pulse with the first polarity. Also, with a read pulse having the second polarity, the threshold voltage detected during the read operation may also be different if write pulse had the first polarity versus the second polarity, and a difference between the two threshold voltages may correspond to a read window for a read pulse with the second polarity. Further, the absolute threshold voltage seen during a read operation may be based on whether the write pulse and the read pulse are of a same or different polarity, and thus the read window may vary slightly (both in the absolute voltages at the margins and in the separation therebetween) depending on whether the read pulse has the first or second polarity. It is to be understood that which of a first polarity (e.g., the word line 110 for the memory cell 105 at a higher voltage than the bit line 115 for the memory cell 105) and a second polarity (e.g., the word line 110 for the memory cell 105 at a lower voltage than the bit line 115 for the memory cell 105) are respectively considered positive and negative is arbitrary.

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. For example, the sense component 125 may be configured to sense a current or charge through the memory cell 105, or a voltage resulting from coupling the memory cell 105 with the sense component 125 or other intervening component (e.g., a signal development component between the memory cell 105 and the sense component 125), responsive to a read operation. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. In some cases, the voltage may be ramped up in magnitude until a current flow is detected. In other cases, determined voltages may be applied sequentially until a current is detected. Likewise, a current may be applied to a memory cell 105 and the magnitude of the voltage to create the current may depend on the electrical resistance or the threshold voltage of the memory cell 105.

The sense component 125 may determine the logic state stored by the memory cell 105 by determining the threshold voltage of the memory cell 105. For example, the sense component 125 may determine a voltage that results in current flow to determine the threshold voltage of the memory cell 105. The sense component 125 may compare the voltage that results in current flow to a reference voltage (e.g., a demarcation read voltage Vain). The sense component 125 may determine the logic state stored by the memory cell 105 based on whether the voltage that results in current flow is higher or lower than the reference voltage. In another example, the sense component 125 may apply a determined voltage to the memory cell 105. The sense component 125 may determine the logic state stored by the memory cell 105 based on whether current flows through the memory cell 105 at the determined voltage.

A read window (e.g., a read window budget, a read margin, or a memory window) may correspond to a difference between the threshold voltages of the memory cell 105, which may correspond to the respective logic states that may be stored by the memory cell 105. It may be desirable to have a large read window (e.g., a large difference between the threshold voltages associated with a logic state '0' versus a logic state '1') as well as a more static read window (e.g., threshold voltages of the memory cell 105 that do not change (drift) substantially over time). A larger read window for the memory cell may increase the reliability of the memory device by increasing the difference between the threshold voltage associated with each logic state. Further, the more static read window (e.g., a read window with less drift), may make determined voltages (e.g., a determined applied voltage, a reference voltage) more reliable or useful over time.

In some cases, a larger read window for each of the memory cells 105 may increase the reliability of the memory device 100. As a result, the memory device 100 may become less reliant or not reliant at all on an external memory controller (e.g., a host device) to increase the reliability of the memory device 100 by various mechanisms such as error correction codes (ECCs), refresh cycles, degradation monitoring, etc. Such mechanisms may be simplified (e.g., less powerful implementations may be utilized without impacting overall performance) or in some cases eliminated (rendered unnecessary) based on the larger read window. For example, the memory device 100 may implement fast ECC at the memory device 100 which may lower a bit error rate at the memory device 100, and due to reliability benefits provided by the larger read window, the ECC at the memory device 100 (on-die ECC) may be simplified or may be sufficient without the use of additional ECC at the host device.

Each memory cell 105 may include multiple layers (components) of self-selecting memory material (e.g., with each layer separated by a carbon electrode) which may increase the size of the read window when compared to a memory cell 105 with a single layer (component) of self-selecting memory material. In some cases, the read window for the memory cell may correspond to or otherwise be based on the sum of the read windows of each layer of self-selecting memory material. This may be due, at least in part, to an interface effect at each layer of the self-selecting memory material. For example, a memory device with two layers of self-selecting memory material may have a read window that is substantially double the size of the read window of a memory cell with only one layer of the self-selecting memory material. In some instances, one or more of the self-selecting memory material layers may be associated with (configured to provide) a decreased leakage of the memory cell (e.g., may be of a different material or stoichiometry or formed differently than one or more of the other the self-selecting memory material layers). Here, such a self-selecting memory material layer may increase the size of the read window, while also decreasing the leakage of the memory cell. The decrease in leakage may allow for an increase in memory array size, which may allow for an increase in tile size of a memory array.

The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purpose.

In some memory architectures, accessing a memory cell 105 may degrade or destroy a logic state stored by one or more memory cells 105, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption.

Figure 2:
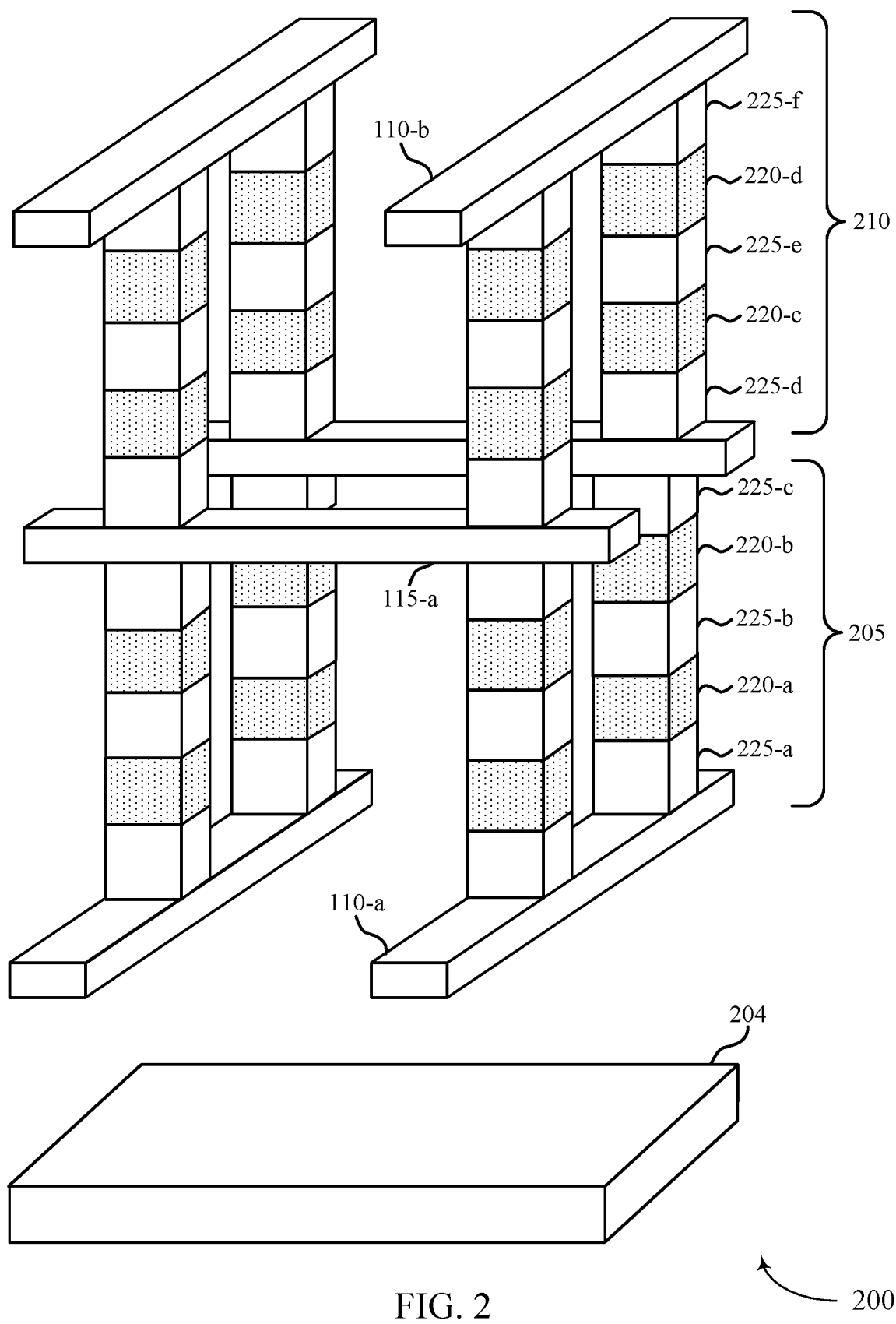
FIG. 2 illustrates an example of a memory array that supports multi-component cell architectures in accordance with examples as disclosed herein.

FIG. 2 illustrates an example of a 3D memory array 200 that supports multi-component cell architectures for a memory device in accordance with examples as disclosed herein. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Though the example of memory array 200 includes two decks 205, 210, it is to be understand that one deck (e.g., a 2D memory array) or more than two decks are also possible.

Memory array 200 may also include word line 110-a and word line 110-b, and bit line 115-a, which may be examples of word line 110 and bit line 115, as described with reference to FIG. 1. Memory cells of the first deck 205 and the second deck 210 each may include one or more self-selecting memory cells. Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 225-a, a first self-selecting memory material 220-a, a second electrode 225-b, a second self-selecting memory material 220-b, and a third electrode 225-c. In addition, memory cells of the second deck 210 may include a first electrode 225-d, a first self-selecting memory material 220-c, a second electrode 225-e, a second self-selecting memory material 220-d, and a third electrode 225-f. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 225-d of the second deck 210 and the third electrode 225-c of the first deck 205 may be coupled to bit line 115-a such that bit line 115-a is shared by vertically adjacent memory cells.

In some examples, the self-selecting memory material 220 may, for example, be a chalcogenide or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some other examples, a SAG-alloy may also contain indium (In), and such chalcogenide material may in some cases be referred to as InSAG-alloy. In some examples, a chalcogenide may include additional elements such as hydrogen (H), oxygen (O), nitrogen (N), chlorine (Cl), or fluorine (F), each in atomic or molecular forms.

In some cases, the self-selecting memory material 220 used in a self-selecting memory cell may be based on an alloy (such as the alloys listed above) and may be operated so as to not undergo a phase change during normal operation of the memory cell (e.g., due to the composition of the chalcogenide material, and/or due to operational voltages and currents configured to maintain the self-selecting memory material 220 in a single phase, such as an amorphous or glass phase). For example, the self-selecting memory material 220 may include a chemical element, such as arsenic, that inhibits crystallization of the chalcogenide material and thus may remain in an amorphous state. Here, some or all of the set of logic states supported by the memory cells (e.g., including self-selecting memory material 220 and electrodes 225) may be associated with an amorphous state of the self-selecting memory material 220 (e.g., stored by the self-selecting memory material 220 while the self-selecting memory material 220 is in the amorphous state). For example, a logic state '0' and a logic state '1' may both be associated with an amorphous state of the self-selecting memory material 220 (e.g., stored by the self-selecting memory material 220 while the self-selecting memory material 220 is in the amorphous state).

During a programming (write) operation of a memory cell (e.g., including electrodes 225-a, self-selecting memory material 220-a, and electrode 225-b), the polarity used for programming (writing) may influence (determine, set, program) a particular behavior or characteristic of the self-selecting memory material 220, such as the threshold voltage of the self-selecting memory material 220. The difference in threshold voltages of the self-selecting memory material 220 depending on the logic state stored by the self-selecting memory material 220 (e.g., the difference between the threshold voltage when the self-selecting memory material 220 is storing a logic state '0' versus a logic state '1') may correspond to the read window of the self-selecting memory material 220.

In some cases, the thickness of the self-selecting memory material 220 may influence a size of the read window. For example, a thicker self-selecting memory material 220 may correspond to a larger read window. However, the increase in read window size associated with an increase in thickness may be relatively small while an associated increase in the programming voltages may be more substantial (e.g., when compared to the increase of the read window size). In some cases, the increase in the thickness of the self-selecting memory material 220 may cause the absolute magnitude of the various threshold voltages of the self-selecting memory material 220 to increase, which may result in the need to use an increased programming voltage or read voltage, or both. In some cases, a higher threshold voltage may drift (e.g., increase) over time at a higher rate than a lower threshold voltage of the self-selecting memory material 220, which may cause the read window to drift (e.g., increase) in size and median voltage over time. Such increase in absolute threshold and operating (read, write) voltages along with such drift may be detrimental to a performance of the memory device, as such phenomena may increase the power consumption of the memory device over time and also may result in a need for more sophisticated circuitry, more robust (voltage-tolerant) circuitry, or both.

In some cases, rather than increasing the thickness of a single layer of self-selecting memory material with a cell, the memory cell may instead include more than one layer of the self-selecting memory material 220. For example, a single memory cell may include three electrodes 225-a, 225-b, and 225-c as well as two self-selecting memory material 220-a and 220-b layers (components). The read window size may increase substantially based on the inclusion of additional, separate self-selecting memory material 220 layers (e.g., when compared to increasing the thickness of a single self-selecting memory material 220 layer to equal the combined thickness of multiple layers), and with relatively less increase in the absolute value of the lower and upper threshold voltages. In some cases, the read window of the memory cell including self-selecting memory materials 220-a and 220-b may be based on the read windows of each self-selecting memory material 220-a and 220-b individually. For example, the read window of the memory cell including self-selecting memory materials 220-a and 220-b may be approximately equal to the summation of the individual read windows for self-selecting memory material 220-a and 220-b.

In some cases, the memory cell may include relatively thin layers of the self-selecting memory material 220. Compared to a single thick layer, the multiple relatively thin layers of the self-selecting memory material 220 may increase the read window while also demonstrating lower absolute threshold voltages and less drift (e.g., increase in threshold voltages/programming voltages over time). That is, the threshold voltages and/or programming voltages of a memory cell including multiple layers of the self-selecting memory material 220 may increase, but the threshold voltages and/or programming voltages may drift upwards less over time (e.g., when compared to a single-layer of the same thickness of the chalcogenide material).

The architecture of memory array 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selector element. For example, DRAM may use a transistor, which is a three-terminal device, as the selector element for each memory cell and may have a larger memory cell area compared to the cross-point architecture. Alternatively, DRAM memory cells may include the cell selector elements underneath the memory cells.

While the example of FIG. 2 shows two memory decks, other configurations are possible. In some examples, a single memory deck of memory cells may be constructed above a substrate 204, which may be referred to as a two-dimensional memory. In some examples, two or more decks of memory cells may be configured in a similar manner in a three-dimensional cross point architecture.

Figure 3A:
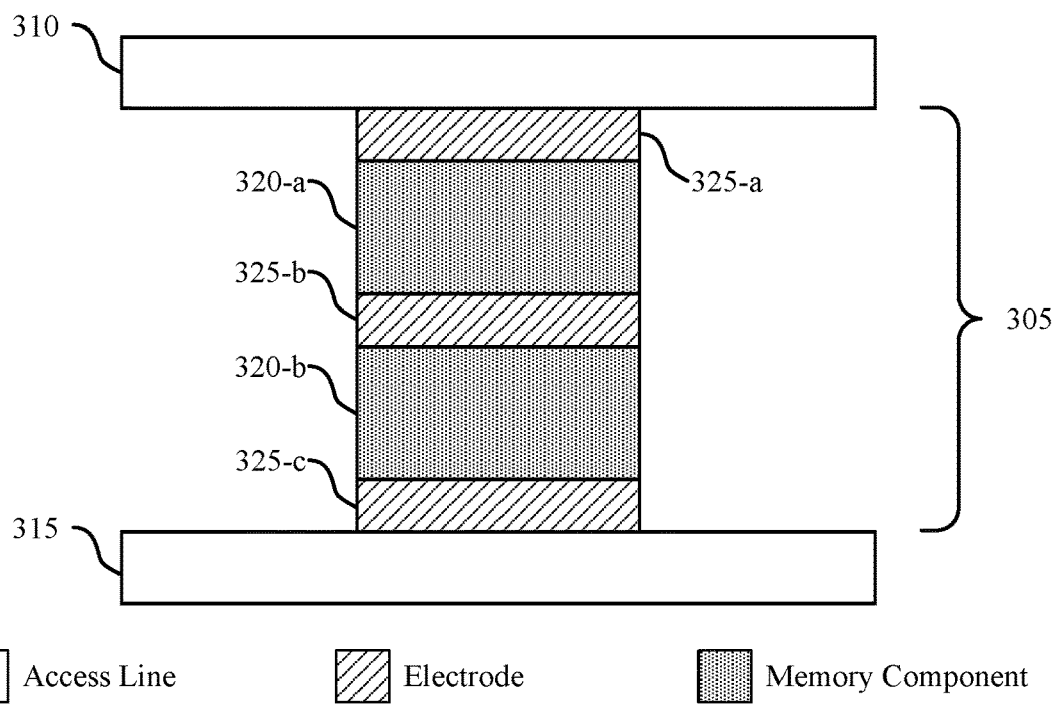
FIGS. 3A, 3B, 4A, and 4B illustrate examples of memory cell stacks and corresponding graphs illustrating the read windows of the memory cells that support multi-component cell architectures in accordance with examples as disclosed herein.

FIG. 3A illustrates an example of a memory cell stack 300-a that supports multi-component cell architectures for a memory device in accordance with examples as disclosed herein. Memory cell stack 300-a may include one or more components described with reference to FIGS. 1 and 2, among others. For example, memory cell stack may include access lines 310 and 315 which may be examples of word lines 110 and bit lines 115, respectively, as described with reference to FIGS. 1 and 2; memory cell 305 which may be examples of memory cells 105 as describe with reference to FIG. 1; electrodes 325 which may be examples of electrodes 225 as described with reference to FIG. 2; and memory components 320 which may be examples of self-selecting memory components and thus may include a self-selecting memory material 220 as described with reference to FIG. 2.

The memory cell stack 300-a may be a part of a cross-point array (e.g., as discussed with reference to FIG. 2) such that the memory cell stack 300-a may be positioned above and/or below another memory cell stack.

Memory cell 305 may be a self-selecting cell where each of the memory components 320 may be configured to simultaneously function as both a storage element and a cell selector element. The memory may include two memory components 320 which may each be or include chalcogenide material (e.g., as described with reference to FIG. 2). In some cases, each of the memory components 320 may be or include a same chalcogenide material (e.g., an SAG-alloy). In some other cases, one or more of the memory components 320 may be or include a different chalcogenide material. For example, memory component 320-a may be or include an SAG-alloy while memory component 320-b may be or include an Si-SAG-alloy or an In-SAG-alloy. While the memory component 320-a may include a chalcogenide material configured to maximize a size of the read window, the memory component 320-b may include a different chalcogenide material (e.g., a different material, a different stoichiometry, formed using different techniques or parameters, or any combination thereof) that is configured to decrease leakage of the memory cell 305. In some cases, decreasing the leakage of the memory cell 305 may enable a memory die (e.g., including memory cell 305 and/or memory cells similar to memory cell 305) to increase in size. Here, the width of the memory components 320 and the electrodes 325 are shown to be substantially the same. However, in some cases, one of the memory component 320 may be wider than the other (e.g., the memory cell 305 may be tapered and thus have a larger or smaller cross sectional area at the top than at the bottom). Further, one or more of the electrodes 325 may be wider than the others.

Each of the two memory components 320-a and 320-b may collectively store a single logic state. That is, a programming pulse applied to the memory cell 305 based on the application of different voltages to bit line 310 and 315 may program the memory cell 305 to store one binary logic state. The polarity of the programming pulse (e.g., based on which of the bit line 310 and the word line 315 is at a higher voltage than the other) may determine the subsequent threshold voltage exhibited by memory component 320-a as well as and subsequent threshold voltage exhibited by memory component 320-b. For example, based on the polarity of the programming pulse, each of the memory components 320 may have a larger or smaller respective threshold voltage. For example, when the programming pulse is of a positive polarity (e.g., when the bit line 310 has a higher voltage than the word line 315 during the programming operation), each memory component 320 in the memory cell 305 may have a larger or smaller threshold voltage as compared to when the programming pulse is of a negative polarity (e.g., causes the word line 315 to have a higher voltage than the bit line 310). A threshold voltage of the memory cell 305 (e.g., the sum of the threshold voltage of memory component 320-a and the threshold voltage of memory component 320-b) that is above some value may represent a logic '1' state, while a threshold voltage of the memory cell 305 that is below that value may represent a logic '0' state, or vice versa.

When the programming pulse has a first polarity (and thus writes a first logic state to the memory cell 305), the programming pulse may cause both of the memory components 320 to have the lower threshold voltage while maintaining both memory components 320 in an amorphous state. In some cases (e.g., in a case that memory component 320-a and 320-b include a same chalcogenide material), the memory components 320 may have a same (or substantially the same) lower threshold voltage. The lower threshold voltage of the memory cell 305 may be based on the lower threshold voltages of each of the memory components 320. For example, the lower threshold voltage of the memory cell 305 may be the sum (or approximately the sum) of the lower threshold voltages of the memory component 320-a and 320-b.

Additionally or alternatively, when the programming pulse has a second polarity (and thus writes a second logic state to the memory cell 305), the programming pulse may cause both of the memory components 320 to have the upper threshold voltage while maintaining both memory components 320 in the amorphous state. In some cases (e.g., in a case that memory component 320-a and 320-b include a same chalcogenide material), the memory components 320 may have a same (or substantially the same) upper threshold voltage. The upper threshold voltage of the memory cell 305 may be based on the upper threshold voltages of each of the memory components 320. For example, the upper threshold voltage of the memory cell 305 may be the sum (or approximately the sum) of the upper threshold voltages of the memory component 320-a and 320-b.

The memory cell 305 may then be read by applying a voltage across the cell to sense the state of the memory cell 305. The threshold voltage seen during a read operation may be based on the polarity of the most recent programming (write) pulse and (e.g., to a lesser degree) the polarity of the read pulse. For example, the memory cell 305 may be read by determining the threshold voltage of the memory cell 305 based on comparison to a reference voltage. In some cases, the reference voltage may be static, and thus may be a demarcation or read voltage that is not calibrated or adjusted over time. The determined threshold voltage of the memory cell 305 may be based on the respective (individual) threshold voltages of memory components 320-a and 320-b (e.g., a summation of the threshold voltages of the memory components 320).

The difference between the threshold voltage when the memory cell 305 is storing a logic state '0' versus a logic state '1' may be the read window (read budget, read margin, memory window). For example, when the memory cell 305 is storing a logic state '0,' the memory cell 305 may have the lower threshold voltage (e.g., based on a combination of the lower threshold voltages of the memory components 320-a and 320-b). Further, when the memory cell 305 is storing a logic state '1,' the memory cell 305 may have the upper threshold voltage (e.g., based on a combination of the upper threshold voltages of the memory components 320-a and 320-b). The read window may correspond to a difference between the lower threshold voltage of the memory cell 305 and the upper threshold voltage of the memory cell 305.

Figure 3B:
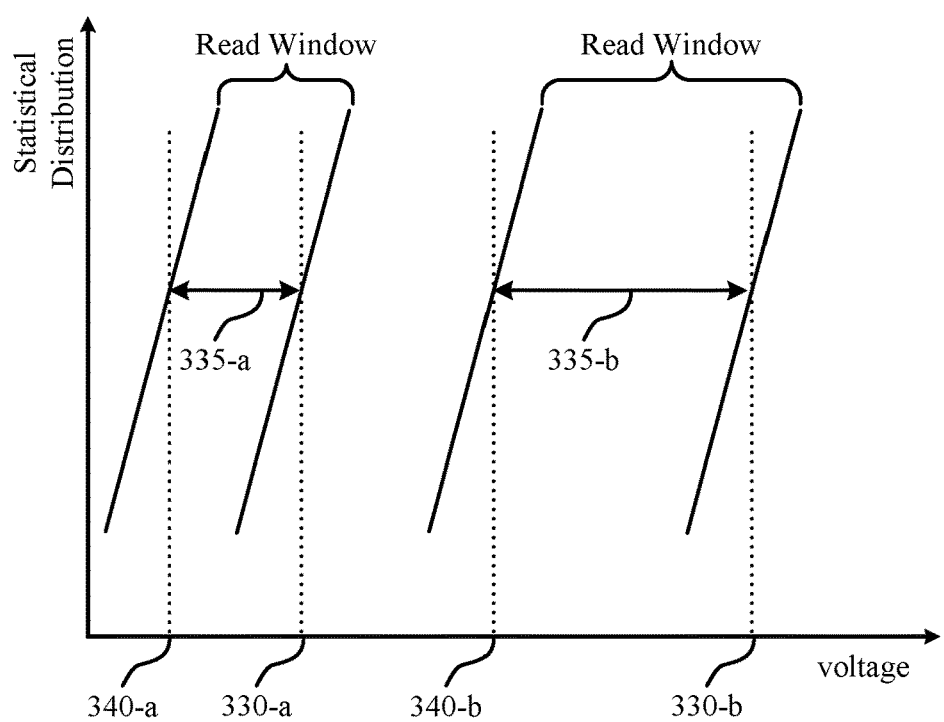

FIG. 3B illustrates an example of a graph 300-b illustrating read windows of a memory device using multi-component cell architectures in accordance with examples as disclosed herein. For example, read windows 335-a and 335-b may correspond to the read windows associated with the memory cell stack 300-a. The graph 300-b may depict median read windows 335-a and 335-b along lines illustrating the statistical distribution of different read windows.

Read window 335-a may represent a median read window of one memory component 320 (e.g., one layer of a self-selecting memory material, such as a self-selecting chalcogenide material). The solid lines indicating the read window 335-a illustrate the statistical distribution of read window 335-a. The read window may have a size corresponding to a difference between the upper threshold voltage 330-a and the lower threshold voltage 340-*a*. For example, and using numbers purely for the sake of illustrative clarity and not as a limiting example, the memory component 320 may have a read window with a lower threshold voltage 340-*a* of two (2) volts and an upper threshold voltage 330-*a* of three (3) volts. Hence, the read window 335-*a* may span one (1) volt.

Read window 335-*b* may represent a read window of a memory cell (e.g., memory cell 305) including two memory components 320. By layering the two memory components 320 (e.g., separated by electrode 325-*b*), the read window of the memory cell 305 may change (increase) from read window 335-*a* to read window 335-*b*. The read window may have a size corresponding to a difference between the upper threshold voltage 330-*b* (which may be equal to or approximately equal to double upper threshold voltage 330-*a*) and the lower threshold voltage 340-*b* (which may be equal to or approximately equal to double lower threshold voltage 340-*a*). For example, and again using numbers purely for the sake of illustrative clarity and not as a limiting example, the memory cell 305 may include two memory components and may have a read window with a lower threshold voltage 340-*b* of four (4) volts and an upper threshold voltage of six (6) volts. Hence, the read window 335-*b* may span two (2) volts.

The increase in read window size may correspond to a corresponding increase in programming voltage, but in some cases, the corresponding increase in programming voltage may be less than the increase that would correspond to a single layer of the self-selecting memory material with sufficient thickness so as to achieve a like read window. Further, the increase in window size may not significantly increase or otherwise impact the drift rate (rate of change over time) of the programming voltage and/or threshold voltages of the memory cell (e.g., when compared to the drift of the programming voltage and/or threshold voltages of a single memory component that is twice as thick each of the memory components 320).

Figure 4A:
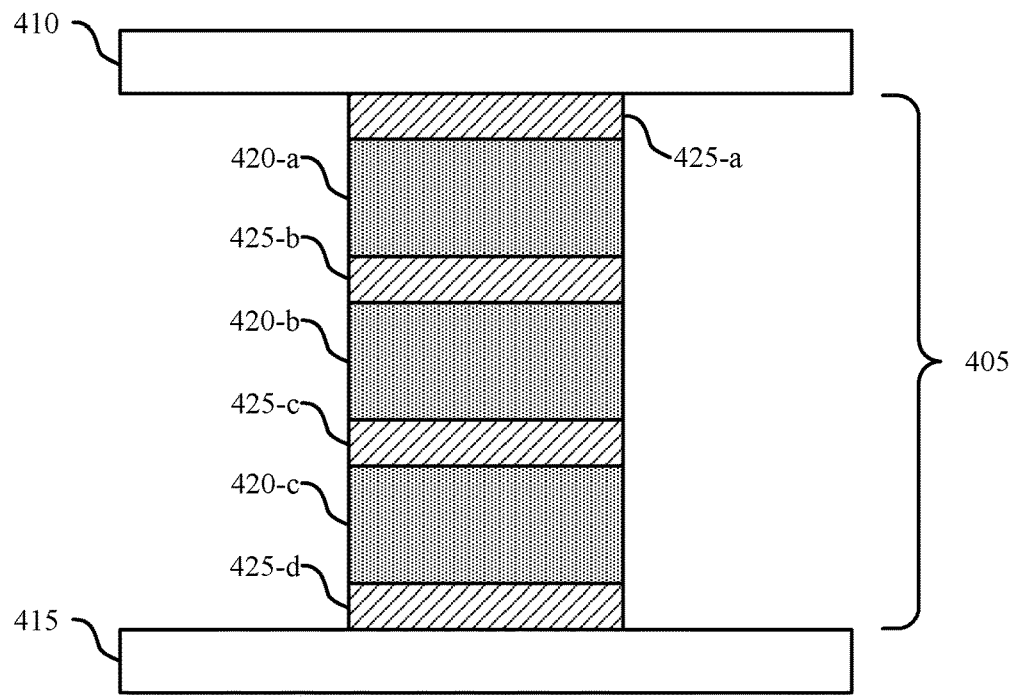

FIG. 4A illustrates an example of a memory cell stack 400-*a* that supports multi-component cell architectures for a memory device in accordance with examples as disclosed herein. Memory cell stack 400-*a* may include one or more components described with reference to FIGS. 1 through 3, among others. For example, memory cell stack may include access lines 410 and 415 which may be examples of word lines 110 and bit lines 115, respectively, as described with reference to FIGS. 1 and 2 and access lines 310 and 315 as described with reference to FIG. 3; memory cell 405 which may be examples of memory cells 105 and 305 as describe with reference to FIG. 1 and FIG. 3; electrodes 425 which may be examples of electrodes 225 and 325 as described with reference to FIGS. 2 and 3; and memory components 420, which may be examples of self-selecting memory components and thus may include a self-selecting memory material such as self-selecting memory material 220 as described with reference to FIG. 2, and may also be examples of memory components 320 as described with reference to FIG. 3. The memory cell stack 400-*a* may be a part of a cross-point array (e.g., as discussed with reference to FIG. 2) such that the memory cell stack 400-*a* may be positioned above and/or below another memory cell stack.

Memory cell 405 may be a self-selecting cell where each of the memory components 420 may be configured to simultaneously function as both a storage element and a cell selector element. The memory may include three memory components 420 which may each be or include chalcogenide material (e.g., as described with reference to FIG. 2). Memory cell 405 may be similar to memory cell 305 but with a third memory component 420-*c*. The additional memory component 420 may further increase the size of the read window. In some cases, each of the memory components 420 may be or include a same chalcogenide material (e.g., an SAG-alloy). In some other cases, one or more of the memory components 420 may be or include a different chalcogenide material. For example, memory component 420-*a* and 420-*b* may be or include an SAG-alloy while memory component 420-*c* may be or include an Si-SAG-alloy or an In-SAG-alloy. While the memory components 420-*a* and 420-*b* may include a chalcogenide material configured to maximize a size of the read window, the memory component 420-*c* may include a different chalcogenide material configured to decrease leakage of the memory cell 405. In some cases, decreasing the leakage of the memory cell 405 may enable a memory die (e.g., including memory cell 405 and/or memory cells similar to memory cell 405) to increase in size. Here, the width of the memory components 420 and the electrodes 425 are shown to be substantially the same. However, in some cases, one of the memory component 420 may be wider than the other (e.g., the memory cell 405 may be tapered and thus have a larger or smaller cross sectional area at the top than at the bottom). Further, one or more of the electrodes 425 may be wider than the others.

Each of the three memory components 420-*a*, 420-*b*, and 420-*c* may collectively store a single logic state. That is, a programming pulse applied to the memory cell 405 based on the application of different voltages to bit line 410 and 415 may program the memory cell 405 to store one binary logic state. The polarity of the programming pulse (e.g., based on which of the bit line 410 and the word line 415 is at a higher voltage than the other) may determine the respective threshold voltages exhibited by memory components 420-*a* and 420-*b*. For example, based on the polarity of the programming pulse, each of the memory components 420 may have a larger or smaller respective threshold voltage. For example, when the programming pulse is of a positive polarity (e.g., when the bit line 410 has a higher voltage than the word line 415 during the programming operation), each memory component 420 in the memory cell 405 may have a larger or smaller threshold voltage as compared to when the programming pulse is of a negative polarity (e.g., causes the word line 415 to have a higher voltage than the bit line 410). Depending on the polarity of the memory cell 405, the resulting threshold voltage may represent a logic '1' or logic '0' state.

When the programming pulse has a first polarity (and thus writes a first logic state to the memory cell 405), the programming pulse may cause all of the memory components 420 to have the lower threshold voltage while maintaining each of the memory components 420 in an amorphous state. In some cases (e.g., in a case that memory components 420 include a same chalcogenide material), the memory components 420 may have a same (or substantially the same) lower threshold voltage. The lower threshold voltage of the memory cell 405 may be based on the lower threshold voltages of each of the memory components 420. For example, the lower threshold voltage of the memory cell 405 may be the sum (or approximately the sum) of the lower threshold voltages of the memory component 420-*a*, 420-*b*, and 420-*c*.

Additionally or alternatively, when the programming pulse has a second polarity (and thus writes a second logic state to the memory cell 405), the programming pulse may cause all of the memory components 420 to have the upper threshold voltage while maintaining each of the memory components in the amorphous state. In some cases (e.g., in a case that memory components 420 include a same chalcogenide material), the memory components 420 may have a same (or substantially the same) upper threshold voltage. The upper threshold voltage of the memory cell 405 may be based on the upper threshold voltages of each of the memory components 420. For example, the upper threshold voltage of the memory cell 405 may be the sum (or approximately the sum) of the upper threshold voltages of the memory component 420-a, 420-b, and 420-c.

The memory cell 405 may then be read by applying a voltage across the cell to sense the state of the memory cell 405. The threshold voltage seen during a read operation may be based on the polarity of the most recent programming (write) pulse and (e.g., to a lesser degree) the polarity of the read pulse. For example, the memory cell 405 may be read by determining the threshold voltage of the memory cell 405 based on comparison to a reference voltage, which may be a static voltage (e.g., a demarcation or read voltage that is not calibrated over time). The determined threshold voltage of the memory cell 405 may be based on the respective (individual) threshold voltages of memory components 420-a, 420-b, and 420-c (e.g., a summation of the threshold voltages of the memory components 420).

The difference between the threshold voltage when the memory cell 405 is storing a logic state '0' versus a logic state '1' may be the read window (read budget, read margin, memory window). For example, when the memory cell 405 is storing a logic state '0,' the memory cell 405 may have the lower threshold voltage (e.g., based on a combination of the lower threshold voltages of the memory components 420-a, 420-b, and 420-c). Further, when the memory cell 405 is storing a logic state '1,' the memory cell 405 may have the upper threshold voltage (e.g., based on a combination of the upper threshold voltages of the memory components 420-a and 420-b). The read window may correspond to a difference between the lower threshold voltage of the memory cell 405 and the upper threshold voltage of the memory cell 405.

Figure 4B:
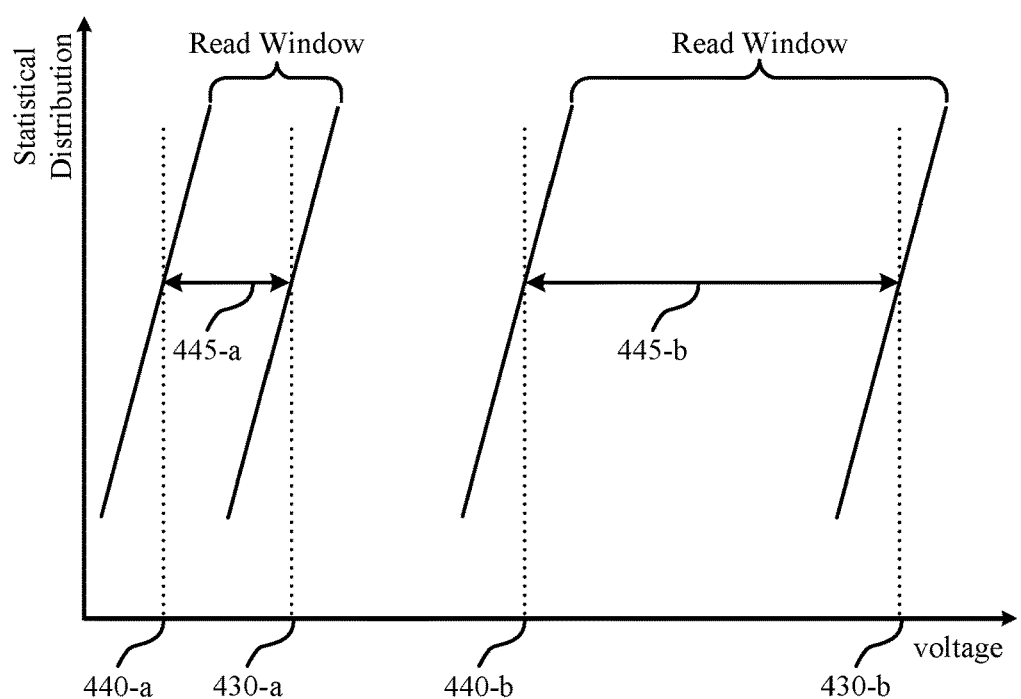

FIG. 4B illustrates an example of a graph 400-b illustrating read windows of a memory device using multi-component cell architectures in accordance with examples as disclosed herein. For example, read windows 445-a and 445-b may correspond to the read windows associated with the memory cell stack 400-a. The graph 400-b may depict median read windows 445-a and 445-b along lines illustrating the statistical distribution of different read windows.

Read window 445-a may represent a median read window of one memory component 420 (e.g., one layer of a self-selecting memory material, such as a self-selecting chalcogenide material). The solid lines indicating the read window 445-a illustrate the statistical distribution of read window 445-a. The read window may have a size corresponding to a difference between the upper threshold voltage 430-a and the lower threshold voltage 440-a. For example, and using numbers purely for the sake of illustrative clarity and not as a limiting example, the memory component 420 may have a read window with a lower threshold voltage 440-a of 1.5 volts and an upper threshold voltage 430-a of 2.5 volts. Hence, the read window 445-a may span one (1) volt.

Read window 445-b may represent a read window of a memory cell (e.g., memory cell 405) including three memory components 420. By layering the three memory components 420 (e.g., separated by electrode 425-b), the read window of the memory cell 405 may change from read window 445-a to read window 445-b. The read window may have a size corresponding to a difference between the upper threshold voltage 430-b (which may be equal to or approximately equal to three times the upper threshold voltage 430-a) and the lower threshold voltage 440-b (which may be equal to or approximately equal to three times the lower threshold voltage 440-a). For example, and again using numbers purely for the sake of illustrative clarity and not as a limiting example, the memory cell 405 may include three memory components and may have a read window with a lower threshold voltage 440-b of 4.5 volts and an upper threshold voltage of 7.5 volts. Hence, the read window 445-b may span three (3) volts.

The increase in read window size may correspond to a corresponding increase in programming voltage, but in some case, the corresponding increase in programming voltage may be less than the increase that would correspond to a single layer of the self-selecting memory material with sufficient thickness so as to achieve a like read window. Further, the increase in window size may not significantly increase or otherwise impact the drift rate of the programming voltage and/or threshold voltage of the memory cell (e.g., when compared to the drift rate of the programming voltage and/or threshold voltage of a memory cell over time with a single memory component that is three times as thick each of the memory components 420).

Although the examples of memory cell stack 300-a and memory cell stack 400-a include two and three self-selecting memory components 320, 420 respectively, it is to be understood that a memory cell (and thus a memory cell stack) may include any number of self-selecting memory components (e.g., layers of self-selecting memory material). In general, a memory cell with N self-selecting memory components (e.g., N layers of self-selecting memory material) may have a lower threshold voltage, an upper threshold voltage, and a read window equal to the respective sums of the lower threshold voltages, upper threshold voltages, and memory windows of the individual self-selecting memory components (e.g., equal to N times the lower threshold voltage, upper threshold voltage, and memory window of each self-selecting memory component, if they are the same for each self-selecting memory component).

Figure 5:
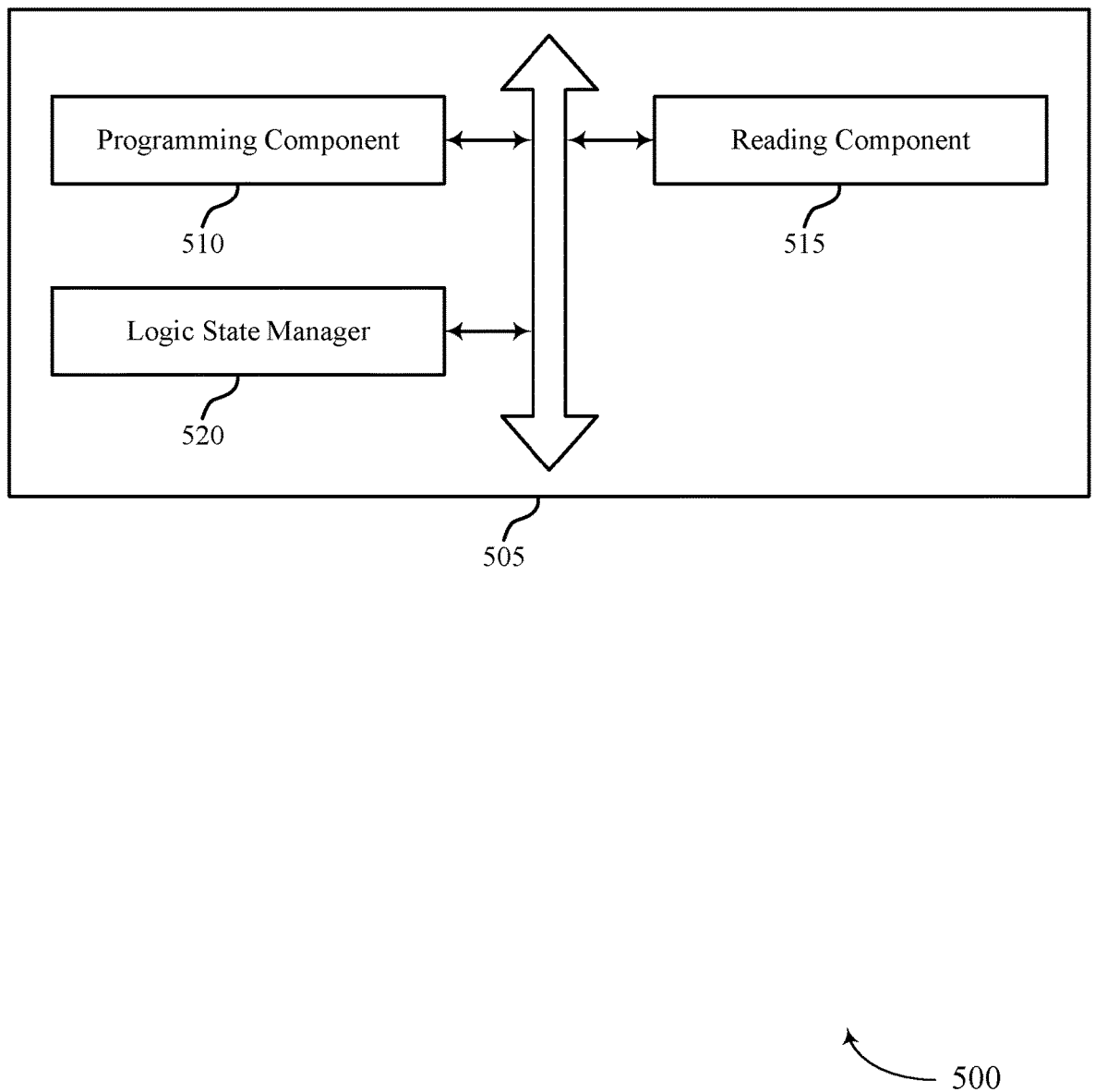
FIG. 5 shows a block diagram of a memory device that supports multi-component cell architectures for a memory device in accordance with examples as disclosed herein.

FIG. 5 shows a block diagram 500 of a memory device 505 that supports multi-component cell architectures for a memory device in accordance with examples as disclosed herein. The memory device 505 may be an example of a memory device as described with reference to FIG. 1 and may include memory arrays, memory stacks, and memory cells as described with reference to FIGS. 2 through 4. The memory device 505 may include a programming component 510, a reading component 515, and a logic state manager 520. Each of these modules may communicate, directly or indirectly, with one another (e.g., via one or more buses).

The programming component 510 may apply a programming (write) voltage (pulse) across a memory cell including a set of self-selecting memory components configured to collectively store one logic state of a set of logic states based on a polarity of the programming voltage, each logic state of the set corresponding to a threshold voltage of the memory cell.

In some examples, the programming component 510 may program each of the set of self-selecting memory components concurrently to have a respective threshold voltage, the respective threshold voltages collectively corresponding to the one logic state.

In some cases, the threshold voltage of the memory cell includes a sum of a set of threshold voltages, each threshold voltage of the set corresponding to a respective self-selecting memory component of the set.

In some cases, the memory cell has a first threshold voltage when the programming voltage has a first polarity and a second threshold voltage when the programming voltage has a second polarity, the first threshold voltage and the second threshold voltage respectively corresponding to a first logic state of the set of logic states and a second logic state of the set of logic states.

The reading component 515 may apply a read voltage across the memory cell after applying the programming voltage.

In some examples, the reading component 515 may apply a first voltage to a first access line coupled with a first self-selecting memory component of the set.

In some examples, apply a second voltage to a second access line coupled with a second self-selecting memory component of the set while applying the first voltage to the first access line, where a difference between the first voltage and the second voltage includes the read voltage.

In some cases, the read voltage has a magnitude between the first threshold voltage and the second threshold voltage.

The logic state manager 520 may determine the one logic state based on applying the read voltage.

In some examples, the logic state manager 520 may determine an amount of current through the memory cell while applying the read voltage, where the amount of current through the memory cell is based on the threshold voltage of the memory cell.

In some cases, the one logic state that is collectively stored by the set of self-selecting memory components represents one bit of information.

Figure 6:
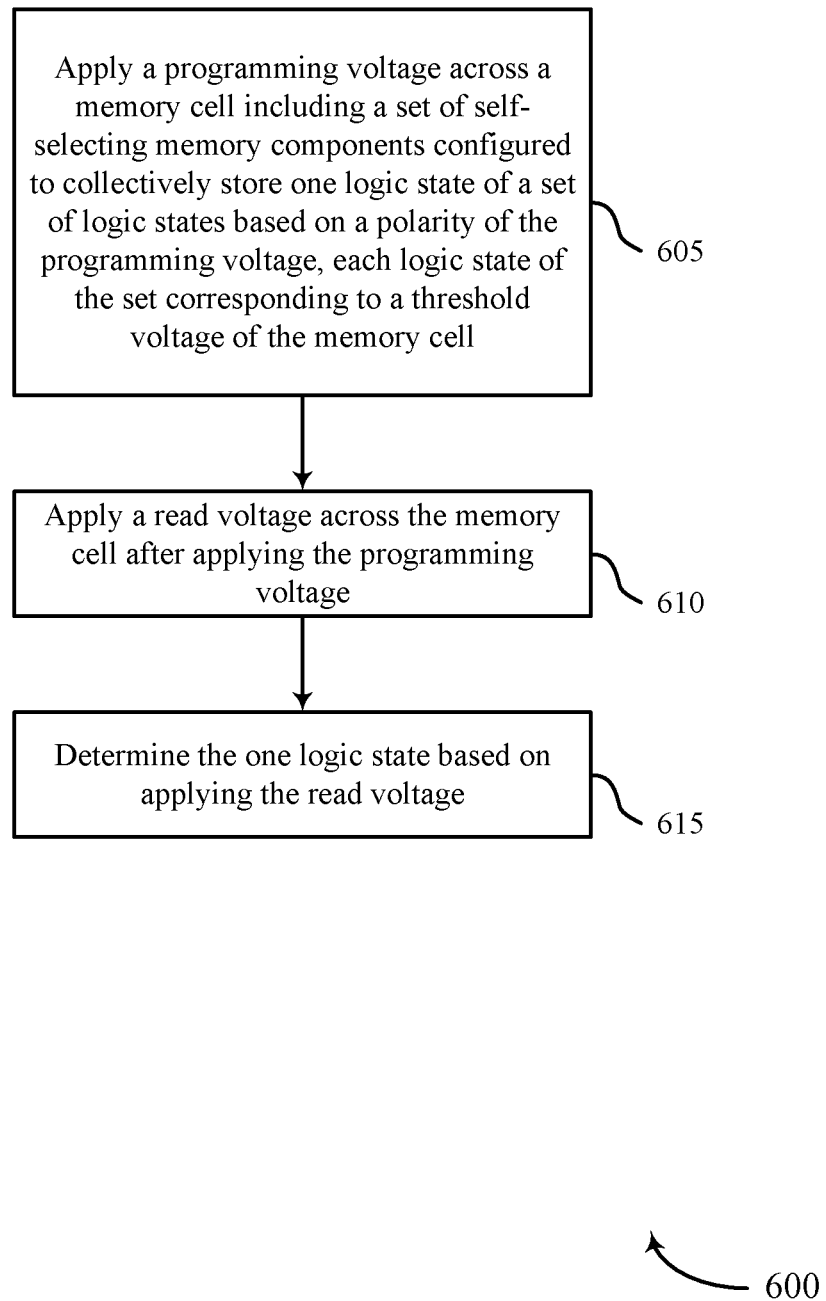
FIGS. 6 and 7 show flowcharts illustrating a method or methods that support multi-component cell architectures in accordance with examples as disclosed herein.

FIG. 6 shows a flowchart illustrating a method or methods 600 that supports multi-component cell architectures for a memory device in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform instances of the described functions using special-purpose hardware.

At 605, the memory device may apply a programming voltage across a memory cell including a set of self-selecting memory components configured to collectively store one logic state of a set of logic states based on a polarity of the programming voltage, each logic state of the set corresponding to a threshold voltage of the memory cell. The operations of 605 may be performed according to the methods described herein. In some examples, the operations of 605 may be performed by a programming component as described with reference to FIG. 5.

At 610, the memory device may apply a read voltage across the memory cell after applying the programming voltage. The operations of 610 may be performed according to the methods described herein. In some examples, operations of 610 may be performed by a reading component as described with reference to FIG. 5.

At 615, the memory device may determine the one logic state based on applying the read voltage. The operations of 615 may be performed according to the methods described herein. In some examples, the operations of 615 may be performed by a logic state manager as described with reference to FIG. 5.

In some examples, an apparatus as described herein may perform a method or methods, such as the method 600. The apparatus may include features, circuitry, means, or instructions (e.g., a non-transitory computer-readable medium storing instructions executable by a processor) for applying a programming voltage across a memory cell including a set of self-selecting memory components configured to collectively store one logic state of a set of logic states based on a polarity of the programming voltage, each logic state of the set corresponding to a threshold voltage of the memory cell, applying a read voltage across the memory cell after applying the programming voltage, and determining the one logic state based on applying the read voltage.

In some cases of the method 600 and the apparatus described herein, applying the programming voltage may include operations, features, means, or instructions for programming each of the set of self-selecting memory components concurrently to may have a respective threshold voltage, the respective threshold voltages collectively corresponding to the one logic state.

In some instances of the method 600 and the apparatus described herein, applying the read voltage may include operations, features, means, or instructions for applying a first voltage to a first access line coupled with a first self-selecting memory component of the set, and applying a second voltage to a second access line coupled with a second self-selecting memory component of the set while applying the first voltage to the first access line, where a difference between the first voltage and the second voltage includes the read voltage.

In some examples of the method 600 and the apparatus described herein, the threshold voltage of the memory cell includes (e.g., is equal to) a sum of a set of threshold voltages, each threshold voltage of the set corresponding to a respective self-selecting memory component of the set.

In some cases of the method 600 and the apparatus described herein, the memory cell may have a first threshold voltage when the programming voltage may have a first polarity and a second threshold voltage when the programming voltage may have a second polarity, the first threshold voltage and the second threshold voltage respectively corresponding to a first logic state of the set of logic states and a second logic state of the set of logic states.

In some instances of the method 600 and the apparatus described herein, the read voltage may have a magnitude between the first threshold voltage and the second threshold voltage.

In some examples of the method 600 and the apparatus described herein, determining the one of the set of logic states may include operations, features, means, or instructions for determining an amount of current through the memory cell while applying the read voltage, where the amount of current through the memory cell may be based on the threshold voltage of the memory cell.

In some cases of the method 600 and the apparatus described herein, the one logic state that may be collectively stored by the set of self-selecting memory components represents one bit of information.

Figure 7:
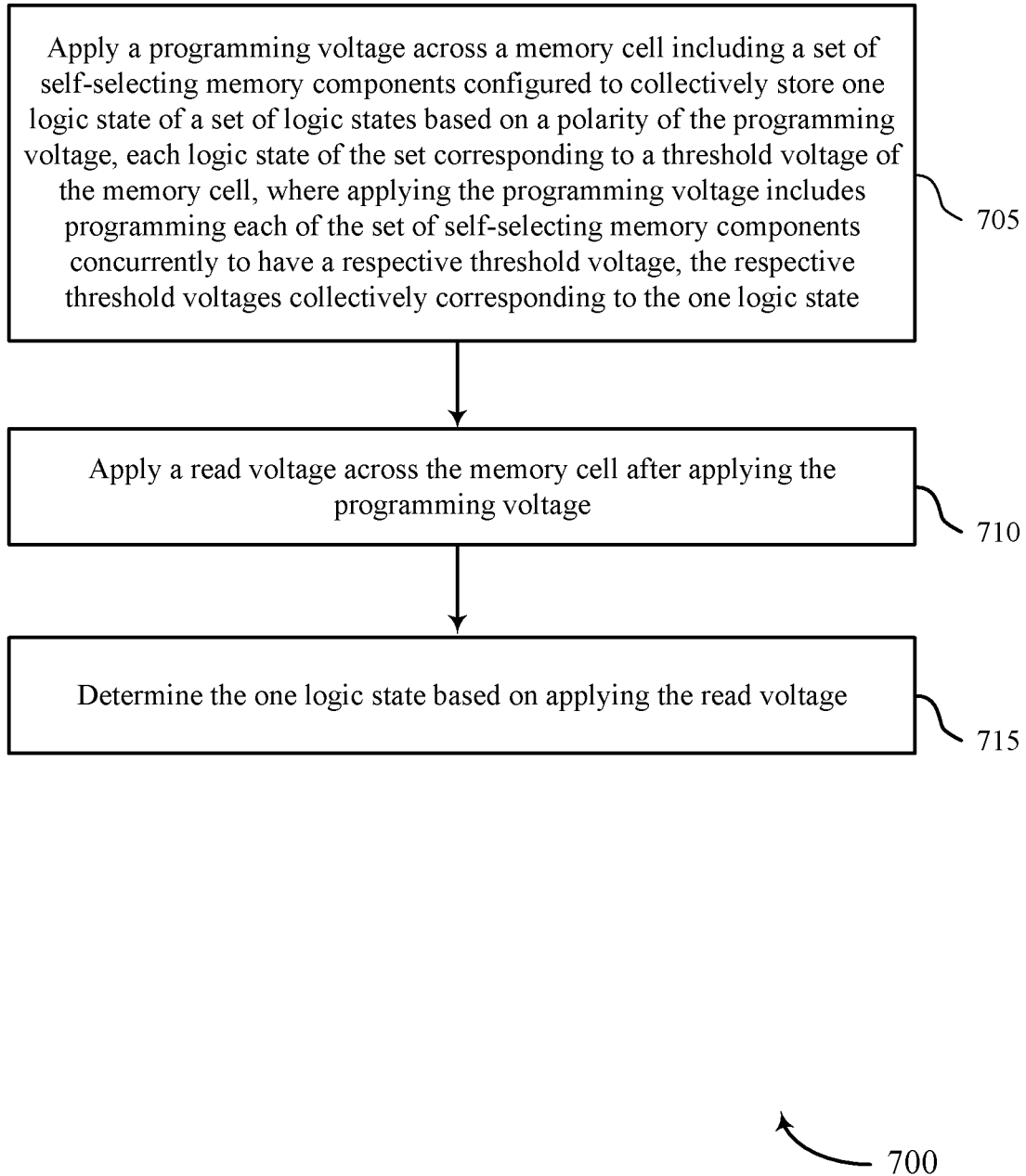

FIG. 7 shows a flowchart illustrating a method or methods 700 that supports multi-component cell architectures for a memory device in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform the described functions using special-purpose hardware.

At 705, the memory device may apply a programming voltage across a memory cell including a set of self-selecting memory components configured to collectively store one logic state of a set of logic states based on a polarity of the programming voltage, each logic state of the set corresponding to a threshold voltage of the memory cell. The memory device may apply the programming voltage by programming each of the set of self-selecting memory components concurrently to have a respective threshold voltage, the respective threshold voltages collectively corresponding to the one logic state. The operations of 705 may be performed according to the methods described herein. In some examples, the operations of 705 may be performed by a programming component as described with reference to FIG. 5.

At 710, the memory device may apply a read voltage across the memory cell after applying the programming voltage. The operations of 710 may be performed according to the methods described herein. In some examples, the operations of 710 may be performed by a reading component as described with reference to FIG. 5.

At 715, the memory device may determine the one logic state based on applying the read voltage. The operations of 715 may be performed according to the methods described herein. In some examples, the operations of 715 may be performed by a logic state manager as described with reference to FIG. 5.

It should be noted that the methods described above describe possible implementations, and that the operations and the steps may be rearranged or otherwise modified and that other implementations are possible. Furthermore, portions from two or more of the methods may be combined.

In some examples, an apparatus with multi-component cell architectures may perform the function described herein using general- or special-purpose hardware. The apparatus may include a first access line, a second access line, and a memory cell coupled with the first access line and the second access line. The memory cell may include a set of self-selecting memory components configured to collectively store one logic state of a set of logic states based on a polarity of a programming voltage applied between the first access line and the second access line.

In some cases, a first self-selecting memory component of the set may be configured to have a first threshold voltage when the programming voltage has a first polarity and a second threshold voltage when the programming voltage has a second polarity, and a second self-selecting memory component of the set may be configured to have a third threshold voltage when the programming voltage has the first polarity and a fourth threshold voltage when the programming voltage has the second polarity.

In some examples, a first logic state of the set of logic states may be based on a combination of the first threshold voltage and the third threshold voltage, and a second logic state of the set of logic states may be based on a combination of the second threshold voltage and the fourth threshold voltage.

Some instances of the apparatus may include a third self-selecting memory component of the set configured to have a fifth threshold voltage when the programming voltage has the first polarity and a sixth threshold voltage when the programming voltage has the second polarity. A first logic state of the set of logic states may be based on a combination of the first threshold voltage, the third threshold voltage, and the fifth threshold voltage, and a second logic state of the set of logic states may be based on a combination of the second threshold voltage, the fourth threshold voltage, and the sixth threshold voltage.

In some examples, the first self-selecting memory component of the set may be configured to have the first and second threshold voltages while in an amorphous state, and the second self-selecting memory component of the set may be configured to have the third and fourth threshold voltages while in an amorphous state.

In some cases, the third threshold voltage may be equal to the first threshold voltage, and the fourth threshold voltage may be equal to the second threshold voltage.

In some examples, the set of self-selecting memory components may be configured to be jointly programmed to collectively store the one logic state. In some instances, the one logic state that is collectively stored by the set of self-selecting memory components may represent one bit of information.

In some examples, the memory cell may further include an electrode disposed between a first self-selecting memory component of the set and a second self-selecting memory component of the set. In some cases, the memory cell further may include a second electrode disposed between the first access line and the first self-selecting memory component, and a third electrode disposed between the second self-selecting memory component and the second access line.

In some examples, the set of self-selecting memory components may each include a same chalcogenide material. In some other examples, a first self-selecting memory component of the set includes a first chalcogenide material, and a second self-selecting memory component of the set includes a second chalcogenide material different from the first chalcogenide material.

Another apparatus with multi-component cell architectures may perform the function described herein using general- or special-purpose hardware. The apparatus may include a memory cell, a first access line coupled with the memory cell, and a second access line coupled with the memory cell. The memory cell may include a first chalcogenide component configured to have a first threshold voltage based on a polarity of a voltage applied between the first access line and the second access line and a second chalcogenide component configured to have a second threshold voltage based on the polarity of the applied voltage. The memory cell may be configured to store a logic state based on a sum of the first threshold voltage and the second threshold voltage.

In some examples, the first threshold voltage may be configured to may have a first magnitude when the applied voltage may have a first polarity and a second magnitude when the applied voltage may have a second polarity. Here, the second threshold voltage may be configured to have a third magnitude when the applied voltage has the first polarity and a fourth magnitude when the applied voltage has the second polarity.

In some cases, the first chalcogenide component and the second chalcogenide component may be both configured to select the memory cell based on the applied voltage.

In some instances, the memory cell may further include a third chalcogenide component configured to have a third threshold voltage based on the polarity of the applied voltage, where the logic state stored by the memory cell may be based on a sum of the first threshold voltage, the second threshold voltage, and the third threshold voltage.

In some examples, the memory cell may further include a first electrode disposed between the first access line and the first chalcogenide component, a second electrode disposed between the first chalcogenide component and the second chalcogenide component, and a third electrode disposed between the second chalcogenide component and the second access line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a digital signal processor (DSP), an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first access line;
a second access line; and
a memory cell coupled with the first access line and the second access line, the memory cell comprising a plurality of self-selecting memory components, wherein each self-selecting memory component is associated with a threshold voltage and the plurality of self-selecting memory components are configured to collectively store one logic state of a set of logic states based at least in part on a polarity of a programming voltage applied between the first access line and the second access line and a combination of the threshold voltages associated with each of the plurality of self-selecting memory components.

2. The apparatus of claim 1, wherein the one logic state that is collectively stored by the plurality of self-selecting memory components represents one bit of information.

3. The apparatus of claim 1, wherein the plurality of self-selecting memory components each comprise a same chalcogenide material.

4. An apparatus, comprising:
a first access line;
a second access line; and
a memory cell coupled with the first access line and the second access line, the memory cell comprising a plurality of self-selecting memory components configured to collectively store one logic state of a set of logic states based at least in part on a polarity of a programming voltage applied between the first access line and the second access line, wherein:
a first self-selecting memory component of the plurality of self-selecting memory components is configured to have a first threshold voltage when the programming voltage has a first polarity and a second threshold voltage when the programming voltage has a second polarity, and
a second self-selecting memory component of the plurality of self-selecting memory components is configured to have a third threshold voltage when the programming voltage has the first polarity and a fourth threshold voltage when the programming voltage has the second polarity.

5. The apparatus of claim 4, wherein:
a first logic state of the set of logic states is based at least in part on a combination of the first threshold voltage and the third threshold voltage, and
a second logic state of the set of logic states is based at least in part on a combination of the second threshold voltage and the fourth threshold voltage.

6. The apparatus of claim 4, further comprising:
a third self-selecting memory component of the plurality of self-selecting memory components configured to have a fifth threshold voltage when the programming voltage has the first polarity and a sixth threshold voltage when the programming voltage has the second polarity, wherein:
a first logic state of the set of logic states is based at least in part on a combination of the first threshold voltage, the third threshold voltage, and the fifth threshold voltage, and
a second logic state of the set of logic states is based at least in part on a combination of the second threshold voltage, the fourth threshold voltage, and the sixth threshold voltage.

7. The apparatus of claim 4, wherein:
the first self-selecting memory component of the plurality of self-selecting memory components is configured to have the first and second threshold voltages while in an amorphous state, and
the second self-selecting memory component of the plurality of self-selecting memory components is configured to have the third and fourth threshold voltages while in an amorphous state.

8. The apparatus of claim 4, wherein:
the third threshold voltage is equal to the first threshold voltage, and
the fourth threshold voltage is equal to the second threshold voltage.

9. An apparatus, comprising:
a first access line;
a second access line; and
a memory cell coupled with the first access line and the second access line, the memory cell comprising a plurality of self-selecting memory components configured to collectively store one logic state of a set of logic states based at least in part on a polarity of a programming voltage applied between the first access line and the second access line, wherein the plurality of self-selecting memory components are configured to be jointly programmed to collectively store the one logic state.

10. An apparatus, comprising:
a first access line;
a second access line; and
a memory cell coupled with the first access line and the second access line, the memory cell comprising a plurality of self-selecting memory components configured to collectively store one logic state of a set of logic states based at least in part on a polarity of a programming voltage applied between the first access line and the second access line, wherein the memory cell further comprises an electrode disposed between a first self-selecting memory component of the plurality of self-selecting memory components and a second self-selecting memory component of the plurality of self-selecting memory components.

11. The apparatus of claim 10, wherein the memory cell further comprises:
a second electrode disposed between the first access line and the first self-selecting memory component; and
a third electrode disposed between the second self-selecting memory component and the second access line.

12. An apparatus, comprising:
a first access line;
a second access line; and
a memory cell coupled with the first access line and the second access line, the memory cell comprising a plurality of self-selecting memory components configured to collectively store one logic state of a set of logic states based at least in part on a polarity of a programming voltage applied between the first access line and the second access line, wherein:
a first self-selecting memory component of the plurality of self-selecting memory components comprises a first chalcogenide material, and
a second self-selecting memory component of the plurality of self-selecting memory components comprises a second chalcogenide material different from the first chalcogenide material.

* * * * *